(12) United States Patent
Kim et al.

(10) Patent No.: US 9,041,993 B2
(45) Date of Patent: *May 26, 2015

(54) MASK

(75) Inventors: Sin Young Kim, Daejeon (KR); Kyung Ki Hong, Chungcheongbukdo (KR); Hyuk Yoon, Gwangmyeong-si (KR); Won Cheul Ju, Chungcheongbuk-do (KR); Yong Il Cho, Goyang-si (KR); Moon Soo Park, Daejeon (KR); Dong Ho Ko, Cheongju-si (KR); Su Young Ryu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 262 days.

This patent is subject to a terminal disclaimer.

(21) Appl. No.: 13/335,126

(22) Filed: Dec. 22, 2011

(65) Prior Publication Data

US 2012/0092742 A1    Apr. 19, 2012

Related U.S. Application Data

(63) Continuation-in-part of application No. PCT/KR2011/005514, filed on Jul. 26, 2011.

(30) Foreign Application Priority Data

Jul. 26, 2010   (KR) .................. 10-2010-0072018
Sep. 15, 2010   (KR) .................. 10-2010-0090604
Dec. 1, 2011    (KR) .................. 10-2011-0127628

(51) Int. Cl.
*G02B 5/00*    (2006.01)
*G03F 7/24*    (2006.01)
*G02F 1/1337*  (2006.01)

(52) U.S. Cl.
CPC ........... *G03F 7/24* (2013.01); *Y10T 428/24802* (2015.01); *G02B 5/005* (2013.01); *G02F 1/133788* (2013.01)

(58) Field of Classification Search
USPC .................. 359/227, 354–359, 726–732; 378/34–35; 101/450.1–473; 430/302–305; 355/53

See application file for complete search history.

(56) References Cited

U.S. PATENT DOCUMENTS

2005/0243297 A1*  11/2005  Banine et al. .................. 355/67
2006/0279679 A1*  12/2006  Fujisawa et al. .............. 349/116
2008/0206682 A1*   8/2008  Won et al. ..................... 430/321
2008/0259305 A1*  10/2008  Goto ............................... 355/67
2013/0143007 A1*   6/2013  Kim et al. .................. 428/195.1

FOREIGN PATENT DOCUMENTS

| JP | 08-248618 A | 9/1996 |
| JP | 10-153707 A | 6/1998 |
| JP | 2001-159713 A | 6/2001 |
| JP | 2005-033179 A | 2/2005 |
| JP | 2006-201273 A | 8/2006 |
| JP | 2006-201538 A | 8/2006 |
| JP | 2006-293197 A | 10/2006 |
| JP | 2009-145539 A | 7/2009 |
| KR | 10-2004-0102862 | 12/2004 |
| TW | 200839454 | 8/2007 |

* cited by examiner

*Primary Examiner* — Jennifer L. Doak
(74) *Attorney, Agent, or Firm* — McKenna Long & Aldridge LLP

(57) ABSTRACT

A light irradiation apparatus and a method of manufacture a photo-aligning layer are disclosed. A mask included in a light irradiation apparatus according to one embodiment is configured to irradiate the light having straightness at a high level of illumination to a subject that is apart from the mask with a certain distance. A photo-aligning layer with a desired alignment pattern can be fabricated using the mask.

10 Claims, 12 Drawing Sheets

MASK

CROSS-REFERENCE TO RELATED APPLICATION

This application is a continuation-in-part of International Application PCT/KR2011/005514, with an international filing date of Jul. 26, 2011, which claims priority to and the benefit of Korean Patent Application Nos. 10-2010-0072018, filed Jul. 26, 2010 and 10-2010-0090604, filed Sep. 15, 2010, and claims priority to and the benefit of Korean Patent Application No. 10-2011-0127628, filed Dec. 1, 2011, the disclosures of which are incorporated herein by reference in their entirety.

BACKGROUND

The present invention relates to a light irradiation apparatus and a method of manufacture a photo-aligning layer.

A liquid crystal panel includes a photo-aligning layer, a compensating film using the liquid crystal, an optical filter, liquid crystal and the like. Among them, the photo-aligning layer aligns the liquid crystal in a desired direction. The photo-aligning layer may be formed by irradiating, for example, linearly polarized light to a layer of a photo-aligning material.

As a liquid crystal panel increases in size, an optical functional film included in the liquid crystal panel also increases in size and accordingly a light irradiated surface for a photo-aligning layer is larger. Accordingly, various methods have been studied to give uniform alignment to a larger photo-aligning layer.

SUMMARY OF THE INVENTION

In one embodiment of the present invention, a mask includes at least one opening to guide light to a subject. A size of the opening may be adjusted according to a distance between the mask and the subject.

In another embodiment of the present invention, an apparatus includes a device to which a subject is mounted and a mask including at least one opening to guide the light to the subject. A size of the opening may be adjusted according to a distance between the mask and the subject.

In still another embodiment of the present invention, a method of generating linearly progressing light includes irradiating light toward a mask including at least one opening to guide the light to a subject and guiding the light irradiated from the opening to the subject. A size of the opening may be adjusted according to a distance between the mask and the subject.

In further embodiment of the present invention, a method of manufacture a photo-aligning layer includes irradiating light toward a mask including at least one opening to guide the light to the photo-aligning layer and guiding the light irradiated from the opening to the photo-aligning layer. A size of the opening may be adjusted according to a distance between the mask and the photo-aligning layer.

BRIEF DESCRIPTION OF THE DRAWINGS

The above and other objects, features and advantages of the present invention will become more apparent to those of ordinary skill in the art by describing in detail embodiments thereof with reference to the attached drawings.

DETAILED DESCRIPTION OF THE PRESENT INVENTION

The present invention provides a light irradiation apparatus and a method of manufacture a photo-aligning layer.

One aspect of the present invention provides a light irradiation apparatus including a device to which a subject is mounted and a mask including at least one opening to guide light to a surface of the subject. A size of the opening is adjusted according to a distance between the mask and the subject.

In one embodiment of the present invention, an "opening capable of guiding light to a surface of a subject (e.g., an irradiated body)" may refer to, for example, an opening configured to allow the light irradiated to one side surface of the mask to be irradiated to the other side surface of the mask through the opening and then to reach the surface of the subject. A structure of the opening will be described in detail hereinafter with reference to FIGS. 1 and 2.

In one embodiment of the present invention, the light irradiated to the other side surface of the mask and then reaching the surface of the subject may be light having straightness (collimated light or nearly collimated light). Here, the "light having straightness" may refer to the light that is spread during the light irradiated to one portion of the mask reaches the surface of the subject or, to the light in which an irradiation direction is rarely changed to an unintended direction or the irradiation into the unintended direction is minimized or suppressed. In one example, the "light having straightness" may refer to the light whose divergence angle is within about ±10°, ±5° or ±3.5° in a process in which the light is irradiated from the other side surface of the mask. Here, the "divergence angle" may refer to an angle formed between a normal orthogonal to a plane of the mask and a moving direction of the light guided by the opening.

In one embodiment of the present invention, the light guided by the opening may be linearly polarized light. The linearly polarized light may be used, for example, to provide alignment to a photo-aligning layer when the subject is the photo-aligning layer.

Figure 1:
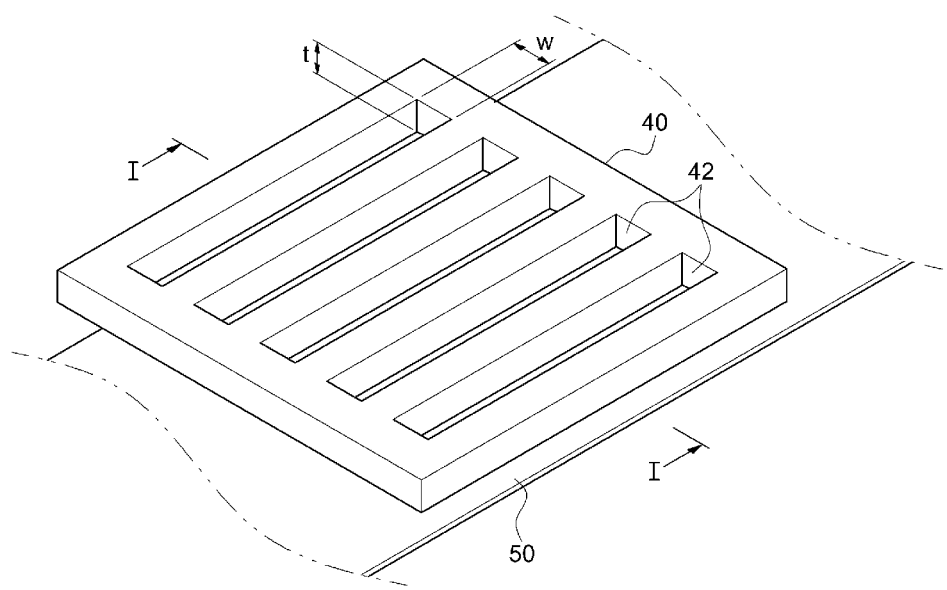
FIG. 1 is a schematic diagram showing a mask according to one embodiment of the present invention.

In one embodiment of the present invention, a size of the opening may be adjusted according to a distance between the surface of the subject irradiated with the guided light and the mask. In this disclosure, the size of the opening being adjusted according to the distance between the surface of the subject and the mask may refer to, for example, a thickness, a width or an aspect ratio of the opening being adjusted in consideration of the distance between the surface of the subject and the mask. For example, the size, the width or the aspect ratio of the opening may be controlled to have a functional relationship with the distance between the surface of the subject and the mask FIG. 1 illustrates an example of a mask 40 according to one embodiment of the present invention. In FIG. 1, the mask 40 includes a plurality of openings 42 extending in the same direction and arranged in parallel to one another. However, the mask according to another embodiment of the present invention may include one opening 42. That is, the number and the arrangement of the openings 42 of the mask 40 are not particularly limited and may be appropriately adjusted according to the type of a subject, that is, an irradiated body. For example, the number and the arrangement form of openings 42 of the mask 40 may be properly adjusted in consideration of the number or form of portions to be exposed when a subject 50 is photoresist and in consideration of the number or form of portions to be aligned or efficiency of a process when the subject 50 is a photo-aligning layer.

A size of the opening 42, for example, a thickness "t", a width "w" or an aspect ratio w/t of the opening 42 may be adjusted according to a distance between a surface of the subject 50 and the mask 40. Here, the thickness "t" of the opening 42 refers to the shortest distance by which the light irradiated to one side of the mask 40 passes through the opening 42, that is, a length of a straight line that vertically connects one side of the mask 40 with the other side. The width "w" of the opening 42 refers to a length of a straight line that vertically connects both sides of the opening 42. By way of an example, the thickness "t" of the opening 42 can be adjusted. The size of the opening 42 may be adjusted to improve straightness of the light irradiated from the opening 42 when the light irradiated from the opening 42 reaches the subject 50.

Figure 2:
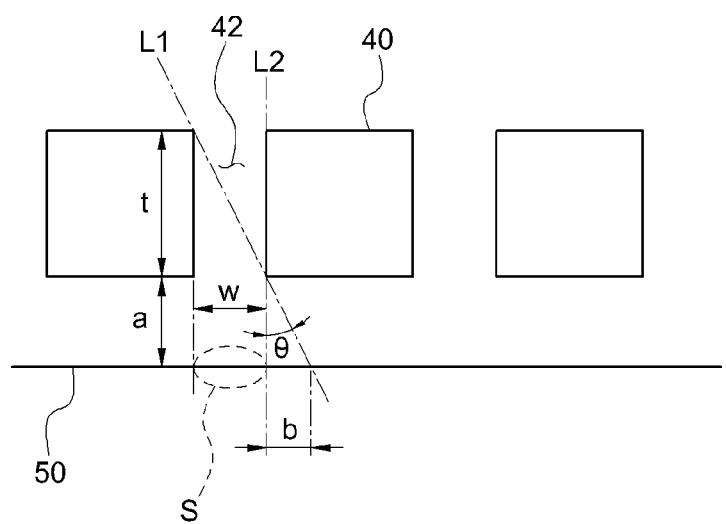
FIG. 2 is a diagram illustrating a relationship of a thickness and a width of the opening of the mask and a distance between the opening and the subject shown in FIG. 1.

FIG. 2 shows a cross-section of the mask of FIG. 1 taken along a line I-I, in which the size of the opening 42 of the mask 40 is adjusted according to a distance between the mask and a surface of the subject 50.

In FIG. 2, L2 denotes the light guided by the opening 42 and having a divergence angle of 0° and L1 denotes the light guided by the opening 42 and having a divergence angle of 0°. The divergence angle may be an angle formed between a normal vertical to a plane of the mask 40 and a progression direction of the light guided by the opening 42, as illustrated in FIG. 2.

According to an embodiment of the present invention, the opening 42 may be formed to generate the light having excellent straightness so that the light is irradiated to a target area on the surface of the subject 50, for example, an area indicated by S in FIG. 2. For example, even when there is light with a great divergence angle, the size of the opening 42 may be adjusted so that a deviation distance in FIG. 2 can be minimized or zero in consideration of the distance between the surface of the subject 50 and the mask 40, for example, a distance indicated by "a" in FIG. 2, such that the light is not irradiated, for example, up to a distance indicated by "b" (hereinafter, "deviation distance") beyond the desired portion S in the subject 50. In FIG. 2, "a" denotes the interval between the subject 50 and the mask 40.

In one example, the deviation distance in FIG. 2 may be defined as a function related to the distance "a" between the subject 50 and the mask 40 and the thickness "t" and the width "w" of the opening 42, as shown in Equation 1.

$$b = (a/t) \times w \quad \text{[Equation 1]}$$

In FIG. 2, an allowable range of the deviation distance may be variously changed according to use of the mask 40. For example, if the width of the pattern of the mask 40 is great, a long deviation distance may be required, and if uniformity of the pattern of the mask 40 is required, a minimized deviation distance may be necessary.

When the mask 40 is used for the exposure of photoresist or alignment of a photo-aligning layer, the deviation distance may be substantially identical to or less than ⅕ of the width "w" of the mask 40. When this is applied to Equation 1, the following Equations 2 and 3 may be derived.

$$b = (a/t) \times w \leq w/5 \quad \text{[Equation 2]}$$

$$5a \leq t \quad \text{[Equation 3]}$$

By using the Equations 1-3, the thickness "t" of the opening 42 may be adjusted to be substantially identical to or greater than about 5 times the distance "a" between the surface of the subject 50 and the mask 40. Alternatively, the thickness "t" may be adjusted to be substantially identical to or greater than about 6, 7, 8, 9 or 10 times the distance "a" according to uses or to a desired exposure portion or photo-aligning portion. An upper limit of the thickness of the opening 42 is adjusted according to a size of a desired deviation area and is not particularly limited. However, if the thickness of the opening 42 increases, the straightness of the light may be enhanced, that is, the divergence angle may decrease, but an illumination level of the light reaching the subject 50 may decrease. In consideration of this point, the upper limit of the thickness may be adjusted, for example, to be about 30, 20 or 15 times the distance "a".

In one example, if the subject 50 is a photo-aligning layer, the thickness of the opening 42 may be adjusted so that the distance "a" between the surface of the subject 50 and the mask 40 is 0 mm to 50 mm. In this range, an appropriate alignment pattern may be embodied for the photo-aligning layer. For example, the distance "a" may be designed to be substantially identical to or greater than 0 mm, 0.001 mm, 0.01 mm, 0.1 mm or 1 mm. Alternatively, the distance "a" may be designed to be substantially identical to or less than 40 mm, 30 mm, 20 mm or 10 mm. The distance "a" may be designed in various combinations of the upper limit and the lower limit.

The width "w" of the opening 42 may be variously adjusted according to uses of the mask 40. In one example, if the mask 40 is used for alignment of a photo-aligning layer used for an optical filter for realizing a stereoscopic image, the width of the opening 42 may be adjusted to be the same as a width of an image-light optical property adjustment area for a left eye (hereinafter, "UL area") or an image-light optical property adjustment area for a right eye (hereinafter, "UR area") formed in the optical filter.

Figure 3:
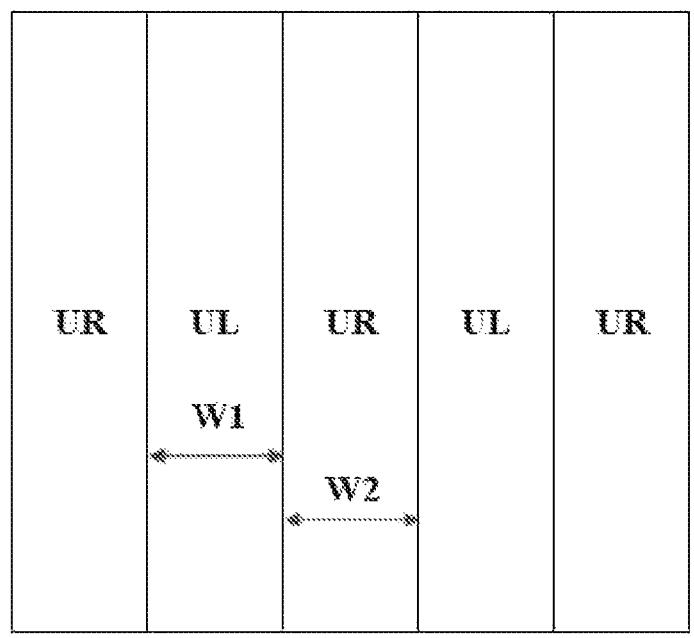
FIG. 3 is a diagram illustrating an optical filter of a stereoscopic image display device.

The optical filter used to realize the stereoscopic image may be configured in various forms, but usually includes a UR area for adjusting an optical property of light incident to a right eye of an observer and a UL area for adjusting an optical property of light incident to a left eye of the observer. The UR and UL areas may be in stripe shapes extending in the same direction and may be alternately arranged to be adjacent to each other, as shown in FIG. 3. In this case, the widths of the respective areas may be defined as W1 and W2 in FIG. 3.

When a photo-aligning layer is used to form the above-described areas, it may be necessary to give alignment so that the alignment pattern of the photo-aligning layer corresponds to the UR or UL area. In this case, the width of the opening 42 of the mask 40 may be designed to be the same as the width of the UR or UL area.

In this case, "the same" refers to substantial sameness in a range in which desired effects are achieved, and may include, for example, a manufacture error or an error taking a variation into consideration. Accordingly, when the width of the opening 42 is the same as the width of the UR or UL area, there may be an error of about ±60 μm, ±40 μm or ±20 μm.

The opening 42 may be in various shapes as long as the opening 42 can guide light as described above, and is not particularly limited to a certain shape. In one example, the opening 42 may be in a shape in which facing inner walls are formed in parallel to each other. In this case, the opening 42 may be in a square or rectangular cross-sectional shape according to the thickness of the mask 40.

Figure 4:
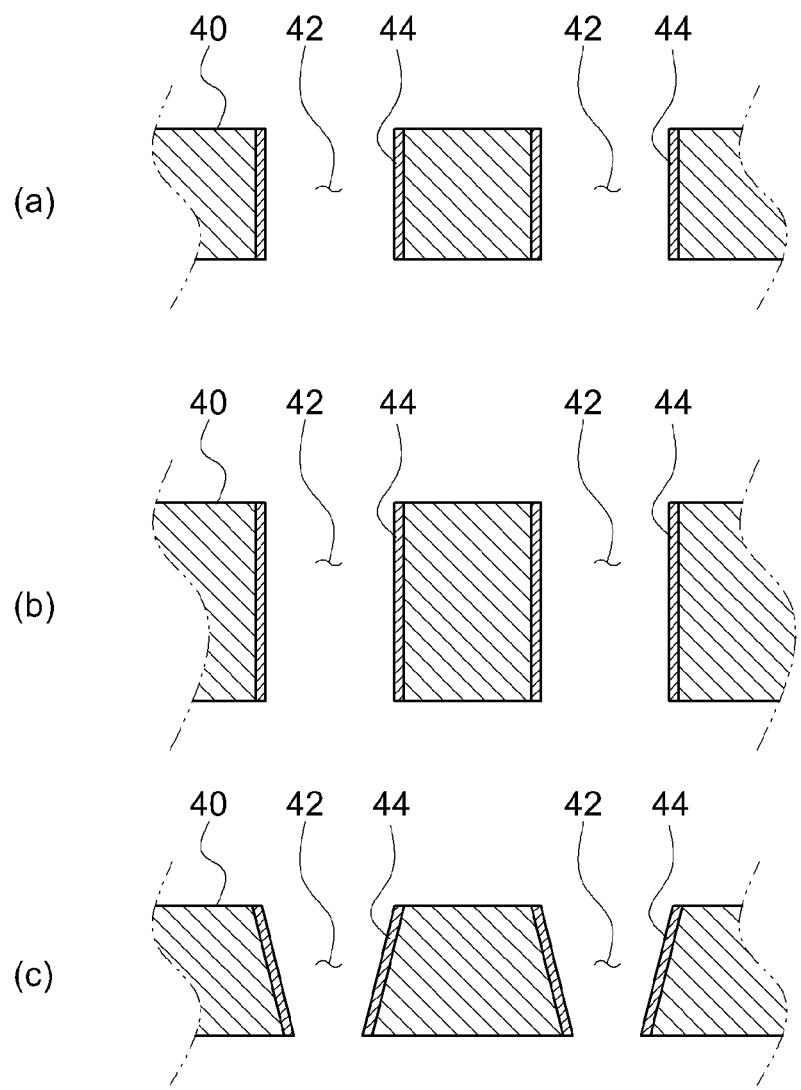
FIG. 4 shows diagrams showing a cross-sectional view of the opening of the mask in FIG. 1.

FIG. 4 illustrates a cross-sectional shape of the opening observed when the mask of FIG. 1 is cut along a line I-I in FIG. 1. The figure (a) in FIG. 4 illustrates a case in which the cross-sectional shape of the opening 42 of the mask 40 is substantially square, and the figure (b) in FIG. 4 illustrates a case in which the cross-sectional shape is substantially rectangular. In another example, the opening 42 may be formed so that a side of the opening 42 to which light is irradiated is wider and a side of the opening 42 from which light guided by the opening 42 is narrow. Thus, the opening 42 may be formed such that the width of the opening 42 becomes narrower from the side to which light is irradiated to the side from which the light is irradiated, as shown in (c) of FIG. 4. In this case, a rate that the width is narrower may be regular or irregular. In another example, although not shown, the width may be narrowed and then widened regularly or irregularly, or may be widened and then narrowed regularly or irregularly.

Further, a total reflection layer 44 may be additionally included in the inner wall of the opening 42, as shown in FIG. 4. This total reflection layer 44 may improve the straightness of the light. The total reflection layer 44 may be formed by coating the inner wall of the opening 42 with a reflective material such as aluminum, copper, nickel, gold or platinum using a deposition method.

According to one embodiment of the present invention, a type of subject 50 to be irradiated with the light guided by the opening 42 of the mask 40 is not particularly limited. For example, the subject 50 may include any subject that may be irradiated with light having straightness. For example, the subject 50 may include photoresist to be exposed or a photo-aligning layer to be optically aligned.

In one example, the subject 50 may have a curved surface to which the light guided by the opening 42 of the mask 40 is irradiated. In this case, the size of the opening 42 may be adjusted in consideration of a radius of curvature of the curved surface of the subject 50.

In one example, the radius of curvature of the curved surface of the subject 50 may be about 150 mm to about 250 mm. In this case, the size of the opening 42, for example, the thickness, may be adjusted within a range of about 5 mm to about 20 mm. If the radius of curvature of the curved surface of the subject 50 and the size of the opening 42 are adjusted as described above, the straightness of the light or the illumination level of the light can be improved.

As one example, a subject to be irradiated in a roll-to-roll process may be an example of the subject 50 whose surface is maintained as a curved surface during the irradiation. A "roll-to-roll process" may irradiate light to a subject while continuously transferring the subject using rolls such as a guide roll, a transfer roll or a winding roll. In this roll-to-roll process, a light may be irradiated to the subject 50 in a state that the subject 50 is wound on the roll. When the light is irradiated in the roll-to-roll process, the light irradiation can be performed on the subject 50 effectively fixed on the roll, and accordingly the irradiation can be effectively accomplished.

Figure 5:
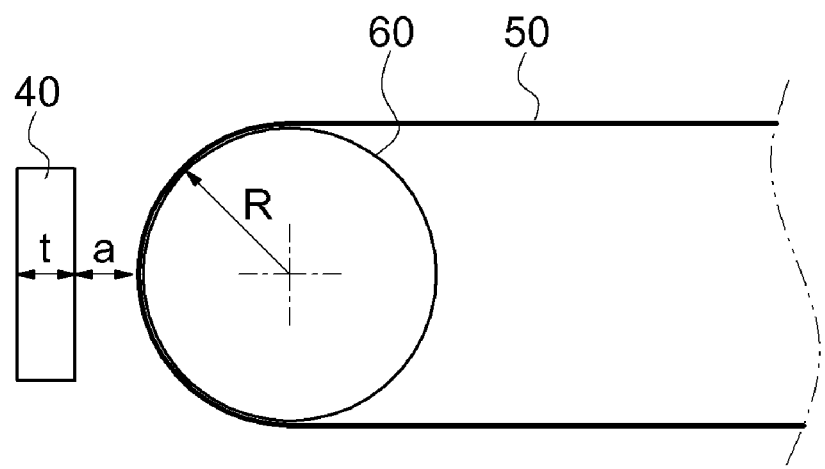
FIG. 5 is a diagram illustrating a mask and a subject in a roll-to-roll process according to one embodiment of the present invention.

FIG. 5 illustrates a process of irradiating light to the subject 50 by using the mask 40 in a roll-to-roll process. As shown in FIG. 5, the subject 50 is wound on a roll 60 and the surface of the subject 50 is a curved surface. In this state, light may be irradiated. In this case, the thickness "t" of the opening 42 of the mask 40 may be adjusted according to a distance "a" between the mask 40 and the subject 50 as described above. Further, a radius of curvature of the surface may be considered. If the mask 40 includes a plurality of openings 42, the thicknesses of the openings 42 may be adjusted equally or differently. When the light is irradiated to the curved surface as illustrated in FIG. 5, the distance "a" between the mask 40 and the subject 50 may differ according to the openings 42. In this case, the thicknesses of the openings 42 may be differently adjusted, but the present invention is not limited thereto.

The present invention also relates to an apparatus including a mask, such as a light irradiation apparatus. The apparatus according to an embodiment of the present invention may include a mask, and a device to mount a subject, e.g., an irradiated body.

In the apparatus, a size of the mask may be adjusted, for example, according to a distance between the subject and the mask in the same manner as described above.

In one example, the device and the mask may be installed so that the distance between the surface of the subject mounted on the device and the mask is greater than about 0 mm and substantially identical to or less than 50 mm. In another example, the device and the mask may be included in the apparatus so that the distance between the surface of the subject and the mask is substantially identical to or greater than, for example, 0.001 mm, 0.01 mm, 0.1 mm, or 1 mm. Further, the device and the mask may be included in the apparatus so that the distance is substantially identical to or less than 40 mm, 30 mm, 20 mm, or 10 mm. It will be apparent to one of skilled in the art that the distance may be in various ranges as long as it is within the above upper and lower values.

In this state, the opening of the mask may be formed to have a thickness substantially identical to or greater than about 5, 6, 7, 8, 9 or 10 times the distance between the surface of the subject and the mask. Alternatively, the thickness of the opening may be substantially identical to or less than about 30, 20 or 25 times the distance, as described above.

In the apparatus, a type of device to which the subject is mounted is not particularly limited and the device may include, for example, any device designed so that the subject is stably maintained while light is being irradiated.

In one example, the device to mount a subject may mount the subject in a state in which the surface of the subject is in a curved shape. An example of this device may be a roll in the above-described roll-to-roll process, but the present invention is not limited thereto.

As described above, the roll may be adjusted so that a radius of curvature of the surface of the subject maintained by the roll is about 150 mm to about 250 mm. Further, in this case, the size of the opening, for example, the thickness, may be adjusted within a range of about 5 mm to about 20 mm. When the radius of curvature and the size of the opening are adjusted as described above, the straightness of the light or the illumination level of the light can be improved.

The apparatus may further include a light source configured to irradiate light to the mask. The light source can be used without limitations as long as the light source can at least irradiate light to the mask. For example, when the mask is for providing alignment to a photo-aligning layer or exposing photoresist, a light source capable of UV irradiation such as a high pressure mercury UV lamp, a metal halide lamp or a gallium UV lamp may be used.

In one example, the light source may be a light source configured to generate light linearly progressed only toward the mask. In general, light irradiated from the light source does not have a particular directivity but is irradiated in all directions. However, if the light source in the apparatus is designed to generate light that can be linearly progressed only toward the mask through an appropriate apparatus configuration, it is possible to more efficiently generate light having straightness by guiding the light using the mask.

The light source may be formed, for example, using a light irradiation unit such as a short-arc discharge lamp, which is a kind of ultraviolet lamp (UV lamp). The short-arc discharge lamp is a discharge lamp using arc discharge plasma in a high pressure mercury vapor as a light source. Since the short-arc discharge lamp is a point light source, the short-arc discharge lamp can uniformly irradiate light to an irradiated surface, compared with a bar-shaped lamp such as a high pressure mercury lamp or a metal halide lamp. Recently, LEDs that irradiates UV light have been commercially used. It is possible to use two or more LEDs as the light irradiation unit in order to improve the uniformity of the illumination intensity.

The light source may include one or a plurality of light irradiation units. When a plurality of light irradiation units is included, any number of the irradiation units or various arrangement form of the irradiation units can be chosen within the scope of the present invention.

In one example, when the light source includes a plurality of light irradiation units, the light irradiation units form two or more rows, in which the light irradiation units located in one of the two or more rows and the light irradiation units located in another adjacent row may be arranged to overlap each other with misalignment.

In this case, the light irradiation units overlapping each other with misalignment may refer to a case in which a line connecting a center of the light irradiation unit present in one row to a center of the light irradiation unit present in another row adjacent to the row is formed in a direction that is not parallel (a direction tilted at a predetermined angle) to a direction orthogonal to each row, and irradiation areas of the light irradiation units overlap each other to some extent in a direction orthogonal to each row.

Figure 6:
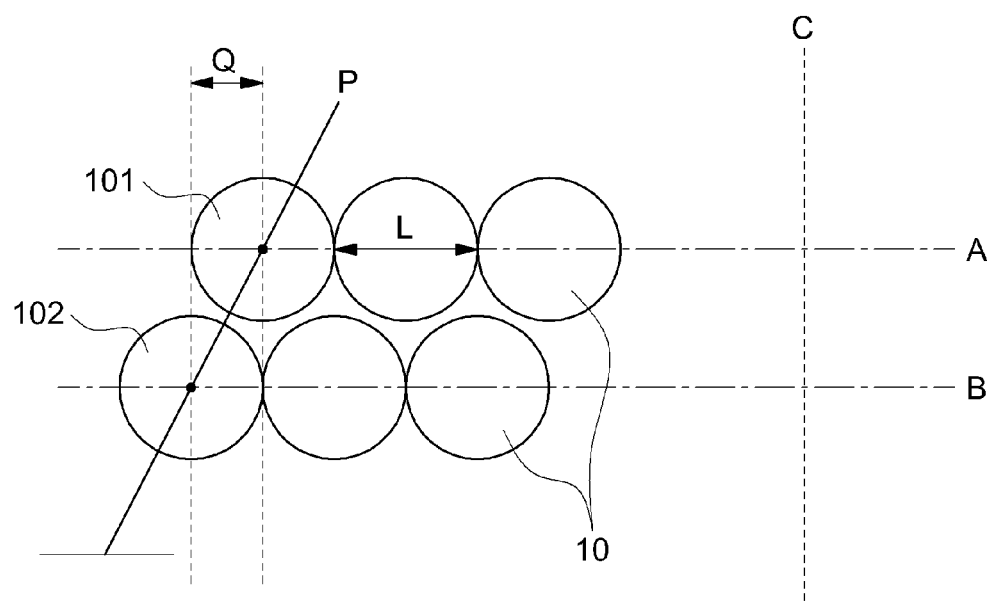
FIG. 6 is a diagram illustrating an arrangement of a light irradiation unit according to one embodiment of the present invention.

FIG. 6 illustrates an arrangement of a light irradiation unit as described above.

In FIG. 6, a plurality of light irradiation units 10 are arranged in two rows, row A and row B. Among the light irradiation units in FIG. 6, the light irradiation unit indicated by 101 is a first light irradiation unit, and the light irradiation unit indicated by 102 is a second light irradiation unit. Line P connecting the first and second light irradiation units is not parallel to a line C orthogonal to directions of rows A and B. Further, an irradiation area of the first light irradiation unit and an irradiation area of the second light irradiation unit overlap by a range Q in the direction orthogonal to the directions of rows A and B.

This arrangement enables an amount of light irradiated by the light source to be uniformly maintained. In this case, an overlapping extent between one light irradiation unit and the other light irradiation unit, for example, a length of Q in FIG. 6, is not particularly limited. For example, the overlapping extent may be about $1/3$ to $2/3$ of a diameter of the light irradiation unit, for example, L in FIG. 6.

The apparatus may further include one or more condensers to adjust an amount of the light irradiated from the light source. The condenser may be included, for example, in the apparatus so that the light irradiated from the light source is incident to and condensed by the condenser, and irradiated to the mask. The condenser may have a general configuration as long as the condenser can condense the light irradiated from the light source. An example of the condenser may include a lenticular lens layer having a lens such as a convex lens formed therein.

The apparatus may further include a polarizing plate. The polarizing plate may be used, for example, to generate linearly polarized light from the light irradiated from the light source. The polarizing plate may be included in the apparatus, for example, so that the light irradiated from the light source is incident to the polarizing plate and the light transmitted through the polarizing plate is irradiated to the mask. For example, if the apparatus includes the condenser, the polarizing plate may be positioned so that the light irradiated from the light source can be incident to the polarizing plate after being condensed by the condenser.

The polarizing plate is not particularly limited as long as the polarizing plate can generate the linearly polarized light from the light irradiated from the light source. Examples of the polarizing plate may include a glass plate or wire grid polarizing plate arranged at a Brewster's angle.

Figure 7:
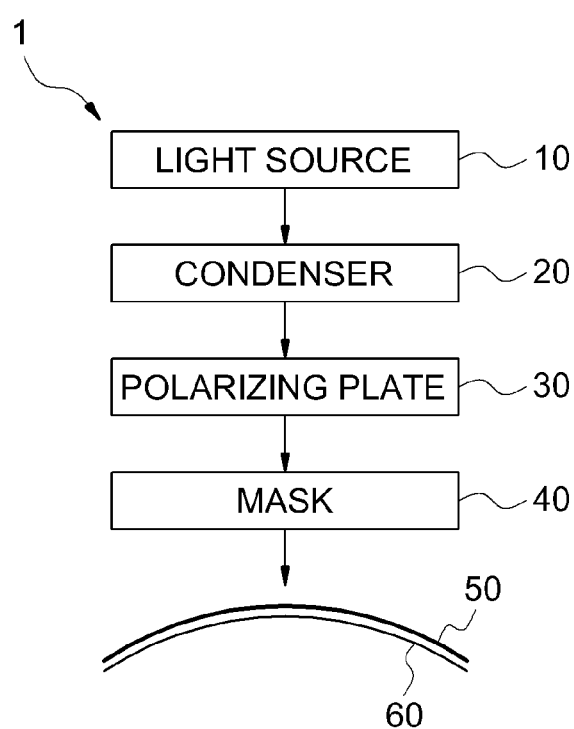
FIG. 7 is a diagram illustrating a light irradiation apparatus according to one embodiment of the present invention.

FIG. 7 illustrates one example of a light irradiation apparatus 1 according to one embodiment of the present invention. In FIG. 7, the apparatus 1 includes a light source 10, a condenser 20, a polarizing plate 30, a mask 40 and device 60 to which a subject 50 is mounted, which are sequentially arranged. In the apparatus 1 of FIG. 7, the light irradiated by the light source 10 is first incident to and condensed by the condenser 20, and then incident to the polarizing plate 30. The light incident to the polarizing plate 30 is generated as linearly polarized light, which is incident to the mask 40, guided by openings, and irradiated to a surface of the subject 50.

The present invention also relates to a method of generating linearly progressed light. One example method may include irradiating light to a mask having one or more openings configured to guide the light to the subject. In the method, a mask as described above may be used as the mask.

The method of generating light according to an embodiment of the present invention includes guiding light irradiated to a mask (e.g., 40 in FIG. 1) to the subject using an opening (e.g., 42 in FIG. 1). In this process, the size of the opening may be adjusted according to the distance between the mask and the subject.

In the method of generating light, the size of the opening of the mask may be adjusted according to the distance between the subject and the mask, for example, in the same manner as described above. In one example, in the method, the distance between the surface of the subject and the mask may be adjusted to be greater than about 0 mm and substantially identical to or less than 50 mm. In another example, the distance between the surface of the subject and the mask may be adjusted, for example, to be substantially identical to or greater than 0.001 mm, 0.01 mm, 0.1 mm or 1 mm. Alternatively, the distance may be adjusted, for example, to be substantially identical to or less than 40 mm, 30 mm, 20 mm or 10 mm. The distance may be designed as various combinations of the upper limit and the lower limit.

In this state, the opening of the mask may be formed to a thickness substantially identical to or greater than about 5, 6, 7, 8, 9 or 10 times the distance between the surface of the subject and the mask. In this state, it is possible to increase generation efficiency of straight progressed light with a minimized divergence angle. The thickness of the opening may be adjusted, for example, to be substantially identical to or less than about 30, 20 or 15 times the distance.

Further, as described above, the method may be performed in a state in which the surface of the subject is maintained as a curved surface. In this case, a radius of curvature of the curved surface of the subject may be adjusted to be about 150 mm to about 250 mm. Further, in this case, the size of the opening, for example, the thickness adjusted according to the radius of the curvature of the subject, may be adjusted within a range of about 5 mm to about 20 mm. If the radius of curvature of the subject and the size of the opening are adjusted as described above, the straightness of the light or the illumination level of the light can be improved.

In one example, a method of generating linearly progressed light may be performed using the above-described light irradiation apparatus. Accordingly, in the method, the light source, the condenser or the polarizing plate described above may be used.

The present invention also relates to a method of manufacture a photo-aligning layer. An method of manufacture a photo-aligning layer may include irradiating light to a mask including one or more openings to guide light to a photo-aligning film. The irradiated light may be guided by the openings and irradiated to the photo-aligning film. In this method, the above-described mask may be used as the mask.

The method of manufacture a photo-aligning layer according to an embodiment of the present invention may include guiding light irradiated to the mask (e.g., 40 in FIG. 1) to the photo-aligning layer using the openings (e.g., 42 in FIG. 1). In the process, the size of the opening may be adjusted according to a distance between the mask and the photo-aligning layer.

In one example, in the method of manufacture a photo-aligning layer, the distance between the surface of the photo-aligning layer and the mask may be adjusted to be greater than about 0 mm and substantially identical to or less than 50 mm. In another example, the distance between the surface of the photo-aligning layer and the mask may be adjusted to be substantially identical to or greater than, for example, 0.001 mm, 0.01 mm, 0.1 mm, or 1 mm. Further, the distance may be adjusted to be substantially identical to or less than, for example, 40 mm, 30 mm, 20 mm or 10 mm. The distance may be designed as several combinations of the upper limit and the lower limit.

Further, the thickness of the opening of the mask may be formed to be substantially identical to or greater than about 5, 6, 7, 8, 9 or 10 times the distance between the surface of the photo-aligning layer and the mask. Light irradiated in this state can be exactly irradiated to a desired portion of the photo-aligning layer with excellent straightness, thus enabling efficient alignment of the photo-aligning layer. The thickness of the opening may be adjusted, for example, to be substantially identical to or less than about 30, 20 or 15 times the distance.

Further, the manufacture of the photo-aligning layer may be performed in a state in which the surface of the photo-aligning layer is maintained as a curved surface. In this case, a radius of curvature of the curved surface of the subject may be adjusted to be about 150 mm to about 250 mm. Further, the size of the opening adjusted according to the radius of curvature of the subject, for example, a thickness, may be adjusted within a range of about 5 mm to about 20 mm. If the radius of curvature of the subject and the size of the opening are adjusted as described above, the straightness of the light or the illumination level of the light can be improved, thus enabling efficient alignment.

In one example, the manufacture of the photo-aligning layer may be performed using the above-described light irradiation apparatus. Accordingly, in the method, the light source, the condenser or the polarizing plate described above may be used.

In this case, a type of photo-aligning layer is not particularly limited and any known photo-aligning layer may be used. In one example, the photo-aligning layer may include a compound whose alignment is determined by cis-trans isomerization, Fries rearrangement or a dimerization reaction derived by linearly polarized irradiation and which can induce alignment in an adjacent liquid crystal layer through the determined alignment. For example, the photo-aligning layer may include an photo-aligning compound having a functional group or residue derived from one or more compound selected from the group comprising azobenzene, styryl benzene, cumarine, chalcone, flurine and cinnamic acid. The photo-aligning compound may be, for example, a monomer, oligomer or polymer compound. An example of the compound may include, for example, norbornene resin including cinnamate residue derived from cinnamic acid.

The photo-aligning layer may be formed, for example, by coating a coating liquid, which is made by diluting the compound described above and additional agent, such as a photoinitiator, as necessary, in an appropriate solvent, using a known coating method such as roll coating, spin coating, or bar coating. In this case, a coating thickness of the alignment layer is not particularly limited and may be adjusted in consideration of a type of a used compound or alignment efficiency.

In one example, the photo-aligning layer may be a first aligned photo-aligning layer. The first alignment may be performed, for example, by irradiating UV light linearly polarized in a certain direction to a photo-aligning layer, for example, an entire surface of the photo-aligning layer before irradiating the linearly polarized UV light through the mask.

The first aligned photo-aligning layer may be appropriately used, for example, when the photo-aligning layer is used as an optical filter for realizing a stereoscopic image.

That is, for example, when linearly polarized UV light is irradiated one or more times for alignment of the photo-aligning layer, the alignment of the alignment layer is determined by a polarization direction of the lastly irradiated light. Accordingly, when the first alignment is performed by irradiating the linearly polarized UV light to the photo-aligning layer in a certain direction, and then only a predetermined portion is exposed to the light linearly polarized in a direction different from the direction used in the first alignment through the mask, the direction of the alignment layer may be changed to a direction different from the direction in the first alignment only in a predetermined portion irradiated with the light. Accordingly, a pattern at least including a first alignment area having a first alignment direction and the second alignment area having the second alignment direction different from the first alignment direction or two types of alignment areas having different alignment directions may be formed in the photo-aligning layer.

In one example, a polarization axis of the linearly polarized UV light irradiated in the first alignment may be orthogonal to a polarization axis of the linearly polarized UV light irradiated in the second alignment performed through the mask following the first alignment. This orthogonality refers to substantial orthogonality and may include, for example, an error substantially identical to or less than about ±10°, ±5° or ±3°. If the polarization axis of the light irradiated in the first and second alignment is controlled in this manner, it is possible to manufacture an optical filter having excellent performance of stereoscopic image realization.

The present invention also relates to a method of manufacture an optical filter. One example manufacturing method may further include forming a liquid crystal layer on a photo-aligning layer formed through the second alignment through the mask as shown in FIG. 1.

The method of forming a liquid crystal layer is not particularly limited. For example, the liquid crystal layer may be formed by coating and aligning crosslinkable or polymerizable liquid crystal compounds on the photo-aligning layer and then crosslinking or polymerizing them by irradiating them with light. Through this step, the layer of the liquid crystal compounds may be aligned and fixed according to the alignment of the photo-aligning layer, resulting in a liquid crystal film including two or more types of areas having different alignment directions of optical axes from each other.

A type of the liquid crystal compound coated on the photo-aligning layer is not particularly limited and may be appropriately selected according to the use of the optical filter. For example, if the optical filter is a filter for realizing a stereoscopic image, the liquid crystal compound may be aligned according to an alignment pattern of the underlying alignment layer and may be a liquid crystal compound to form a liquid crystal polymer layer exhibiting a $\lambda/4$ phase difference characteristic through photo-crosslinking or photo-polymerization. In this case, "$\lambda/4$ phase difference characteristic" may refer to a characteristic capable of phase-delaying incident light by a ¼ wavelength. With the liquid crystal compound, it is possible to manufacture an optical filter capable of splitting, for example, incident light into left circular polarized light and right circular polarized light.

In the above process, the method of coating the liquid crystal compound and performing alignment, that is, aligning the liquid crystal compound according to the alignment pattern of the underlying alignment layer or the method of crosslinking or polymerizing the aligned liquid crystal compound is not particularly limited. For example, the alignment may be performed in a manner of maintaining the liquid crystal layer at an appropriate temperature at which liquid crystal compound can exhibit a liquid crystal property according to the type of liquid crystal compound. Further, the crosslinking or polymerization may be performed by irradiating light at such a level that appropriate crosslinking or polymerization can be derived according to the type of liquid crystal compound, to the liquid crystal layer.

The present invention also relates to a photo-aligning layer. An photo-aligning layer may be manufactured according to the above-described method.

In one example, the photo-aligning layer is used for the above-described optical filter for realizing a stereoscopic image, and may at least include the first alignment area aligned in a first direction and the second alignment area aligned in a second direction.

The first alignment area and the second alignment area may be, for example, alternately arranged to be adjacent to each other while being in a stripe shape extending in the same direction, as in the arrangement of the UR and UL areas in FIG. 3.

In the photo-aligning layer, an area of a non-aligned portion may be substantially identical to or less than 10% of a total area of the photo-aligning layer. In another example, the area of the non-aligned portion may be substantially identical to or less than 9%, 8%, 7%, 6%, 5%, 4%, 3% or 2% of the total area of the photo-aligning layer. The non-aligned portion may be generated, for example, due to a phenomenon in which incident light is spread while passing through an interval between the photo-aligning layer and the mask in a light irradiation process for photo-aligning. This non-aligned portion makes a boundary between alignment areas unclear and may cause, for example, crosstalk in a process of realizing a stereoscopic image.

However, the photo-aligning layer manufactured according to one embodiment of the present invention can adjust the size of the mask according to the distance between the mask and the photo-aligning layer, and, thus, the generation of the non-aligned portion can be suppressed or minimized.

In this case, the non-aligned portion may be measured in the following method. That is, the photo-aligning layer is arranged such that an alignment direction of the photo-aligning layer corresponds to an absorption axis, between two polarizers arranged such that absorption axes of the polarizers are formed vertical to each other. If light is irradiated to any one of the polarizers, light leakage is caused only in an area corresponding to a non-aligned portion of the alignment layer at the other polarizer side. Accordingly, a ratio of the area of the non-aligned portion may be measured by calculating an area of a portion where the light leakage occurs using a polarizing microscope in the above state.

The present invention also relates to an optical filter. An optical filter may include a photo-aligning layer. Further, the optical filter may further include a phase retardation layer formed in at least one surface of the photo-aligning layer.

The phase retardation layer may be, for example, the liquid crystal layer formed in the previously described method, such as a layer including a polymerized or crosslinked liquid crystal compound exhibiting a $\lambda/4$ phase difference characteristic. This liquid crystal layer is formed, for example, according to the alignment pattern of the underlying photo-aligning layer, and may include a first area aligned according to the first alignment area and having a land axis in a first direction, and a second area aligned according to the second alignment area and having a land axis in a direction different from the first direction.

The optical filter may have a crosstalk rate substantially identical to or less than 5% or 2%, which is calculated using the following Equation 4:

$$X_T = (X_{TL} + X_{TR})/2 \qquad \text{[Equation 4]}$$

In Equation 4, $X_T$ denotes a crosstalk rate of a stereoscopic image display device having an optical filter mounted thereto, $X_{TL}$ denotes a crosstalk rate observed by a left eye in the stereoscopic image display device having an optical filter mounted thereto, and $X_{TR}$ denotes a crosstalk rate observed by a right eye in the stereoscopic image display device having an optical filter mounted thereto.

In Equation 4, $X_{TL}$ and $X_{TR}$ may be calculated as in Equations 5 and 6, respectively.

$$X_{TL} = \{(L_{(LB-RW)} - L_{(LB-RB)}/L_{LW-RB)} - L_{(LB-RB)})\} \times 100 \qquad \text{[Equation 5]}$$

$$X_{TR} = \{(L_{(LW-RB)} - L_{(LB-RB)}/L_{(LB-RW)} - L_{(LB-RB)})\} \times 100 \qquad \text{[Equation 6]}$$

where $L_{(LB-RW)}$ denotes the brightness measured when in a display device of the stereoscopic image display device having an optical filter, light is not transmitted in an image signal generation area for a left eye and is transmitted in an image signal generation area for a right eye, $L_{(LB-RB)}$ denotes the brightness measured when in the display device, light is not transmitted in the image signal generation area for a left eye or the image signal generation area for a right eye, and $L_{(LW-RB)}$ denotes the brightness measured when in the display device, light is transmitted in the image signal generation area for a left eye and is not transmitted in the image signal generation area for a right eye.

The optical filter may be formed using a photo-aligning layer having a minimized or suppressed non-aligned area as described above. Thus, the optical filter has an excellent crosstalk rate in the above-described range.

The present invention also relates to a stereoscopic image display device. An stereoscopic image display device may include an optical filter. The optical filter may be included in the stereoscopic image display device as an optical splitting device capable of splitting light in order to realize a stereoscopic image.

In one example, the stereoscopic image display device may further include a display device configured to generate an image signal for a left eye (hereinafter, L signal) and an image signal for a right eye (hereinafter, R signal). Further, the optical filter may have a phase retardation layer including a first area having a land axis in a first direction and a second area having a land axis in a direction different from the first direction. In this case, any one of the first and second areas may be a UL area arranged such that the L signal generated in the display device can be transmitted and the other area may be a UR area arranged such that the R signal generated in the display device can be transmitted.

The stereoscopic image display device may be manufactured using any known method as long as the stereoscopic image display device includes an optical filter as an optical splitting device.

Figure 8:
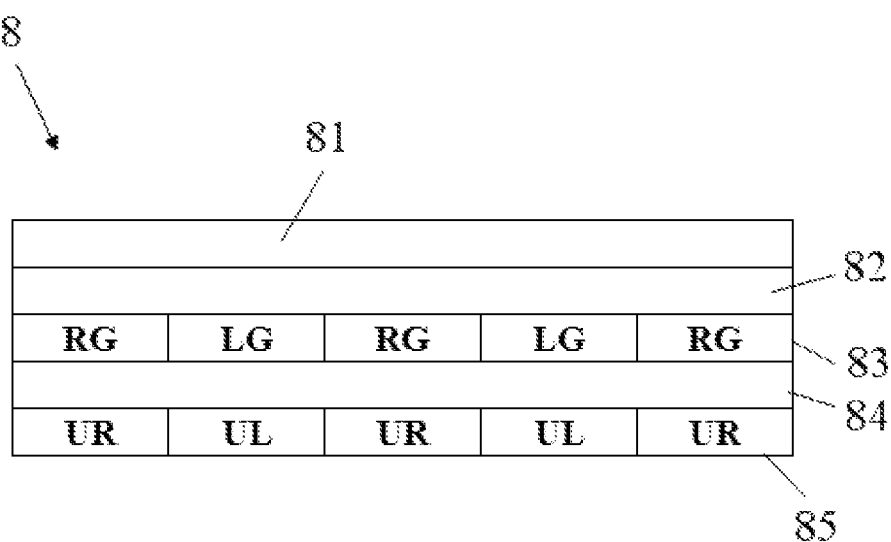
FIG. 8 is a diagram illustrating a stereoscopic image display device according to one embodiment of the present invention.

FIG. 8 illustrates one stereoscopic image display device that enables an observer to wear polarized glasses and observe a stereoscopic image.

As shown in FIG. 8, a stereoscopic image display device 8 may sequentially include, for example, a light source 81, a first polarizing plate 82, a display device 83 configured to generate R and L signals, a second polarizing plate 84, and an optical filter 85.

One example of the light source 81 may include a direct-lit or edge-lit backlight that is generally used for a liquid crystal display (LCD).

In one example, the display device 83 may be a transmissive liquid crystal display panel including a plurality of unit pixels arranged in row and/or column directions. One or at least two pixels may be combined to form an image signal generation area for a right eye for generating the R signal (hereinafter, RG area) and an image signal generation area for a left eye for generating the L signal (hereinafter, an LG area).

The RG and LG areas may, for example, be in stripe shapes extending in the same direction and be alternately arranged to be adjacent to one another according to the arrangement form of the UR and UL areas shown in FIG. 3. The optical filter 85 may include a phase retardation layer having the first and second areas formed as described above. The first and second areas are UL or UR areas. In consideration of the arrangement form of the RG and LG areas, the first and second areas may be arranged so that an R signal transferred from the RG area is incident to the UR area through the second polarizing plate 84, and an L signal is incident to the UL area through the second polarizing plate 84.

The display device 83 is, for example, a liquid crystal panel including a first transparent substrate, a pixel electrode, a first alignment layer, a liquid crystal layer, a second alignment layer, a common electrode, a color filter, and a second transparent substrate, which are sequentially arranged from the light source 81. The first polarizing plate 82 may be attached at a light input side of the panel, i.e., at a side of the light source 81, and the second polarizing plate 84 and the optical filter 85 may be attached in order at the opposite side. The polarizers included in the first and second polarizing plates 82 and 84 may be arranged so that absorption axes of the polarizers form a predetermined angle, for example, 90°. This enables light output from the light source 81 to be transmitted through or blocked by the display device 83.

In a driving state, the unpolarized light from the light source 81 may be output to the first polarizing plate 82. Among the light incident to the first polarizing plate 82, the light having a polarization axis in a direction parallel to a light transmission axis of the polarizer of the first polarizing plate 82 may be transmitted through the first polarizing plate 82 and incident to the display device 83. The light incident to the display device 83 and transmitted through the RG area is the R signal and light transmitted through the LG area is the L signal. The R and L signals may be incident to the second polarizing plate 84.

Among the light incident to the optical filter 85 through the second polarizing plate 84, the light transmitted through the LC area and the light transmitted through the RG area are output in different polarization states. The R signal and the L signal in the different polarization state may be incident to the right eye and the left eye of the observer wearing the polarized glasses, respectively. Thus, the observer can observe the stereoscopic image.

With the light irradiation apparatus and method according to the embodiment of the present invention, the light having excellent straightness can be irradiated at a high illumination level to an irradiated surface separate at a certain distance using the mask having the openings formed therein. Accordingly, for example, an alignment area having a minimized non-aligned portion can be simply and efficiently formed with a precisely embodied alignment pattern even for a large-area photo-aligning layer. Further, the illustrated mask is effective even when a continuous process using a roll-to-roll process is performed.

Hereinafter, embodiments of the present invention will be described in detail. However, the present invention is not limited to the embodiments disclosed below, but can be implemented in various forms. The following embodiments are described in order to enable those of ordinary skill in the art to embody and practice the present invention.

Example 1

Manufacturing of Mask

A mask having the configuration as shown in FIG. 1 in which a width "w" of each opening was 540 μm, a thickness "t" of each opening was 100 mm, and an interval between the openings was about 540 μm was manufactured, and used to form the following photo-aligning layer.

Manufacturing of Optical Filter

Using the manufactured mask, the apparatus as shown in FIG. 7 was produced. Specifically, the apparatus was designed using a UV lamp, a general collimator lens and a wire grid polarizing plate as the light source, the condenser and the polarizing plate, respectively, so that the light irradiated from the light source was condensed by the condenser and then was incident to the mask through the polarizing plate.

A photo-aligning layer and an optical filter were then manufactured in the following manner. First, the photo-aligning layer was formed by coating in a drying thickness of 1,000 the liquid for photo-aligning layer formation having a polycinnamate compound on a triacetyl cellulose (TAC) base having a thickness of 80 μm. Particularly, the photo-aligning layer was formed by coating the TAC base with the coating liquid in a roll coating method, drying the resultant TAC base for 2 minutes at 80° C., and eliminating a solvent. In this case, a solution was obtained by mixing a mixture of polynorbornene (weight average molecular weight ($M_w$)=150,000) having a cinnamate group of Formula 1 and acrylate monomer with a photoinitiator (Igacure 907) and melting the resultant mixture in a cyclohexanone solvent so that a solid concentration of polynorbornene was 2 wt % (polynorbornene:acrylate monomer:photoinitiator=2:1:0.25 (weight ratio)).

[Formula 1]

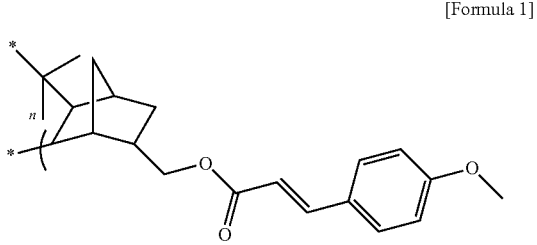 [SMILES: *C1C2CC(CC2COC(=O)/C=C/c2ccc(OC)cc2)C1C(*)(C)C]

For the first alignment, the linearly polarized UV light (300 mW/cm²) was then irradiated onto the photo-aligning layer not through the mask. The manufactured mask was arranged on the firstly aligned photo-aligning layer. Then, for the second alignment, the linearly polarized UV light (300 mW/cm²) having a polarization axis at 90° with respect to the linearly polarized UV light used in the first alignment was irradiated onto the photo-aligning layer through the mask illustrated above. Following the second alignment process, a phase retardation layer having a λ/4 wavelength characteristic was formed on the alignment layer. Specifically, the photo-aligning layer was coated in a drying thickness of about 1 μm with a liquid crystal compound (LC242™ commercially available from BASF), aligned according to the alignment of the underlying photo-aligning layer, irradiated with UV light (300 m W/cm²) for about 10 sec to crosslink and polymerize the liquid crystal, resulting in an optical filter including areas having different land axis directions according to the alignment of the underlying photo-aligning layer.

Example 2

An optical filter was manufactured in the same manner as in Example 1 except that the mask and the photo-aligning layer were closely adhered to each other with no interval therebetween in the second alignment process for a photo-aligning layer.

Example 3

An optical filter was manufactured in the same manner as in Example 1 except that an interval between the mask and the photo-aligning layer was adjusted to be about 1 mm in the second alignment process for a photo-aligning layer.

Comparative Example 1

An optical filter was manufactured in the same manner as in Example 1 except that an interval between the mask and the photo-aligning layer was adjusted to be about 2 mm in the second alignment process for a photo-aligning layer.

Confirmation Example 1

Confirmation of Alignment State

Figure 9:
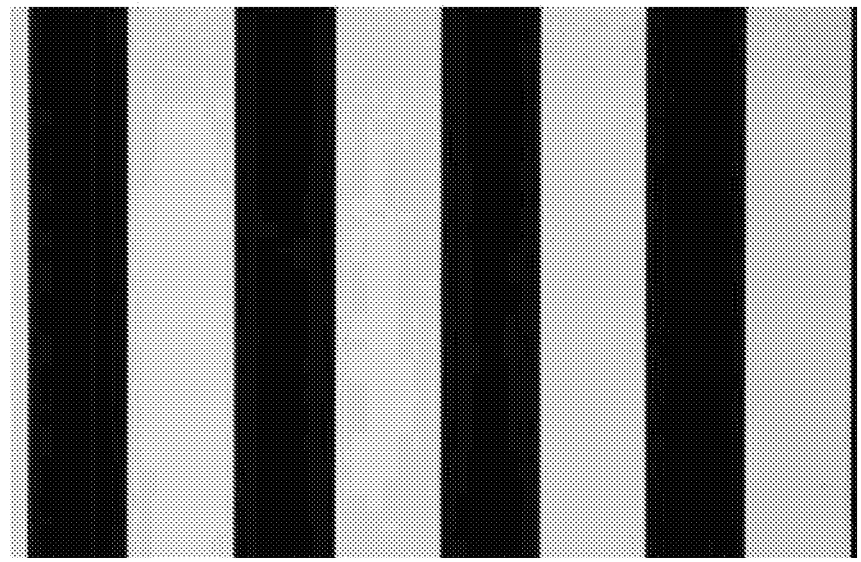
FIGS. 9 to 12 are diagrams illustrating states of the photo-aligning layers formed in Examples and Comparative Example, respectively.
Figure 10:
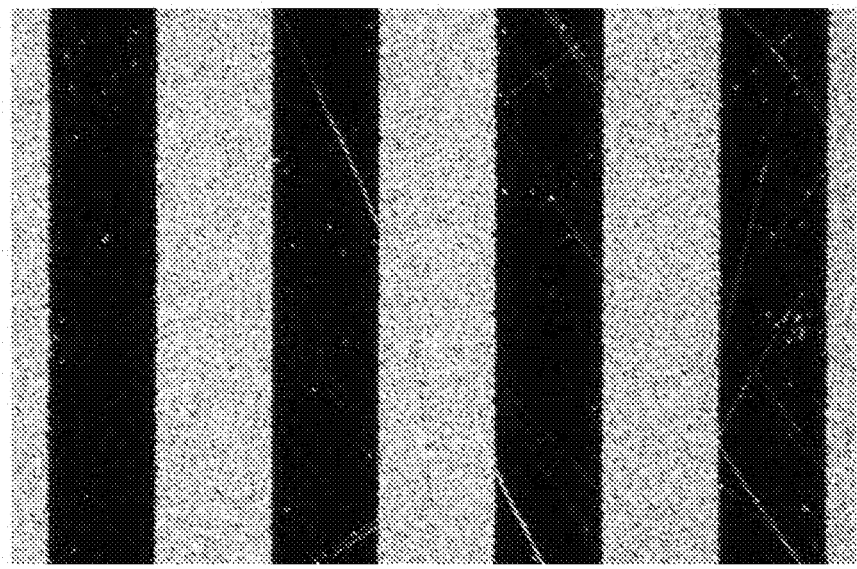
Figure 11:
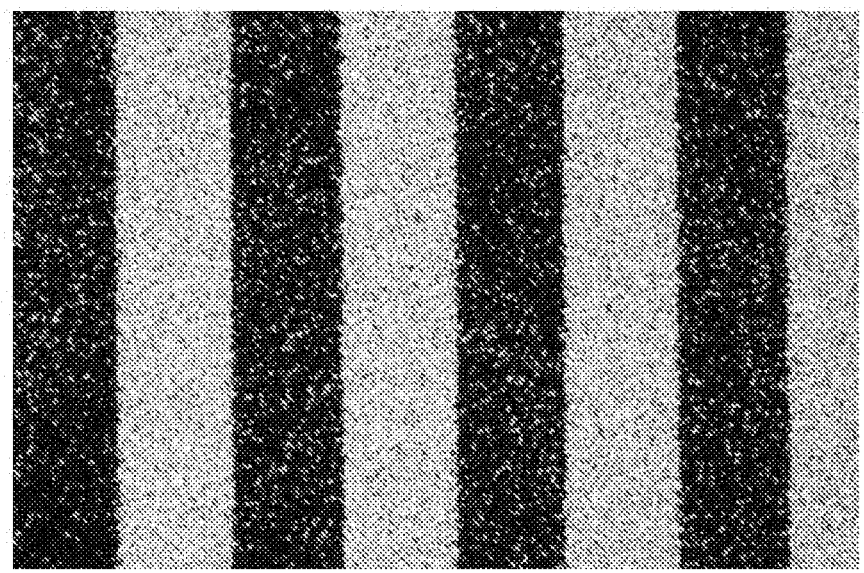
Figure 12:
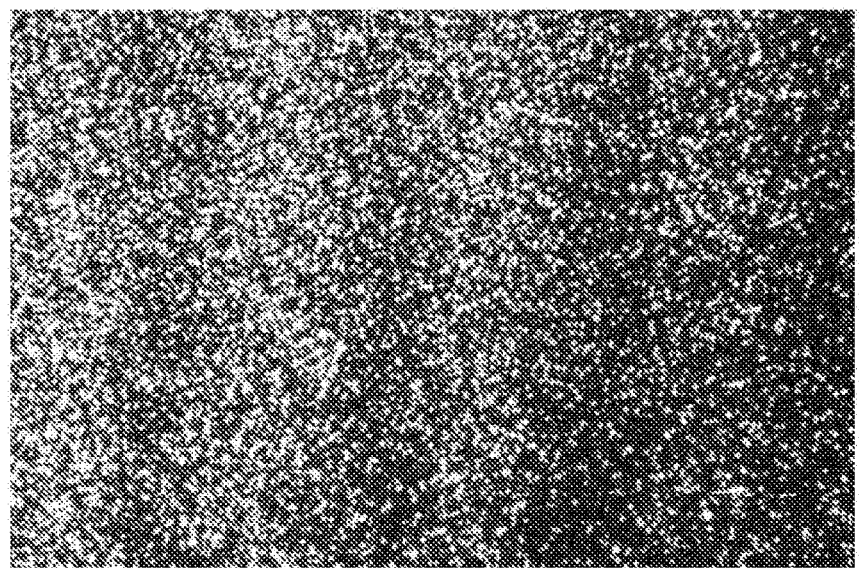

For the optical filters manufactured in Examples and Comparative Example, a pattern forming state of a phase retardation layer was observed. FIG. 9 is an enlarged photograph showing a state of the photo-aligning layer formed in Example 1, and FIGS. 10, 11 and 12 are enlarged photographs showing states of the photo-aligning layers formed in Example 2, Example 3, and Comparative Example 1. As confirmed from FIGS. 9 to 12, if the thickness of the opening is adjusted according to the interval between the mask and the alignment layer, boundaries between patterns were clearly observed, and otherwise, the boundaries were unclear.

In FIGS. 10 to 12, when left and right eye images having different polarization characteristic emitted through the optical filter are seen through one lens of the stereoscopic glasses, if a retardation film of the glasses is orthogonal to the alignment direction, a dark portion is displayed, and if the retardation film of the glasses is parallel to the alignment direction, a white portion is displayed. Further, when the images are seen through the other lens, the dark portion and the white portion of the same film can be confirmed to be reversely displayed.

As a result, in the formed patterns of FIGS. 10 to 12, the dark portion indicates a portion aligned vertical to the retardation film of the stereoscopic glasses, and the white portion indicates a portion aligned parallel to the retardation film of the stereoscopic glasses.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method of generating linearly progressing light, comprising:
   irradiating light toward a mask including at least one opening to guide the light to a subject; and
   guiding the light irradiated from the opening to the subject, wherein the opening is defined by the following Equation:

$$5a \le t \qquad \text{[Equation]}$$

(a: a distance between the mask and the subject, t: a thickness of the opening),
   wherein a size of the opening is adjusted according to the distance between the mask and the subject,
   wherein the subject has a curved surface, and
   wherein the curved surface of the subject has a curvature radius of 150 mm to 250 mm.

2. The method according to claim 1, wherein the distance between the mask and the subject is maintained to be greater than 0 mm and substantially identical to or less than 50 mm.

3. The method according to claim 1, wherein the size of the opening is adjusted according to the curvature radius of the curved surface of the subject.

4. The method according to claim 3, wherein the thickness of the opening is 5 mm to 20 mm.

5. A method of manufacturing a photo-aligning layer, comprising:
   irradiating light toward a mask including at least one opening to guide the light to the photo-aligning layer; and
   guiding the light irradiated from the opening to the photo-aligning layer,
   wherein a size of the opening is adjusted according to a distance between the mask and the photo-aligning layer,
   wherein the opening is defined by the following Equation:

$$5a \le t \qquad \text{[Equation]}$$

(a: the distance between the mask and the subject, t: the thickness of the opening), wherein the photo-aligning layer has a curved surface, and wherein the curved surface of the photo-aligning layer has a curvature radius of 150 mm to 250 mm.

6. The method according to claim 5, wherein the distance between the mask and the photo-aligning layer is maintained to be greater than 0 mm and substantially identical to or less than 50 mm.

7. The method according to claim 5, wherein the thickness of the opening is 5 mm to 20 mm.

8. The method according to claim 5, wherein the photo-aligning layer includes an photo-aligning compound having a functional group derived from one or more compound selected from the group consisting of azobenzene, styryl benzene, cumarine, chalcone, and cinnamic acid.

9. A photo-aligning layer manufactured using the method according to claim 5, wherein an area of a non-aligned portion is substantially identical to or less than 10% of a total area.

10. An optical filter comprising the photo-aligning layer according to claim 9 and a phase retardation layer formed on at least one surface of the photo-aligning layer.

\* \* \* \* \*